United States Patent [19]

Adair et al.

[11] Patent Number: 4,772,532
[45] Date of Patent: Sep. 20, 1988

[54] GLOSSABLE DEVELOPER SHEET WITH REDUCED TACK

[75] Inventors: Paul C. Adair, Springboro; Cheryl L. Moore, Springfield, both of Ohio

[73] Assignee: The Mead Corporation, Dayton, Ohio

[21] Appl. No.: 27,390

[22] Filed: Mar. 18, 1987

[51] Int. Cl.$^4$ .................. G03C 1/71; G03C 1/68; G03C 1/96; G03C 1/495

[52] U.S. Cl. .................................. 430/138; 503/207; 503/214; 427/145; 427/146; 427/150; 428/327; 428/420; 428/913; 428/914; 430/211; 430/350; 430/961

[58] Field of Search ............... 430/138; 427/150, 145, 427/146; 346/207, 214; 428/327, 420, 913, 914

[56] References Cited

U.S. PATENT DOCUMENTS

| | | | |
|---|---|---|---|
| 3,455,721 | 7/1969 | Phillips et al. | 117/36.2 |
| 3,466,184 | 9/1969 | Boweler et al. | 428/537.5 X |
| 3,617,410 | 11/1971 | Clark | 260/41 R |
| 3,672,935 | 6/1972 | Miller et al. | 428/530 X |
| 3,924,027 | 12/1975 | Saito et al. | 427/147 |
| 4,199,619 | 4/1980 | Oda et al. | 427/150 |
| 4,226,962 | 10/1980 | Stolfo | 427/150 X |
| 4,399,209 | 8/1983 | Sanders et al. | 430/138 |
| 4,416,966 | 11/1983 | Sanders et al. | 430/138 |
| 4,422,670 | 12/1983 | Hasegawa et al. | 428/328 |
| 4,440,846 | 4/1984 | Sanders et al. | 430/138 |
| 4,461,495 | 7/1984 | Nakasato et al. | 346/211 |
| 4,470,058 | 9/1984 | Bodmer | 346/212 |
| 4,554,235 | 11/1985 | Adair et al. | 430/138 |
| 4,647,952 | 3/1987 | Pokora et al. | 427/150 |

*Primary Examiner*—Mukund J. Shah
*Attorney, Agent, or Firm*—Smith & Schnacke

[57] ABSTRACT

A developer sheet having reduced tack useful in forming reproductions having a controllable gloss finish or in forming transparencies is provided. The developer sheet has a support with a layer on the surface of the support of a finely divided thermoplastic developer material and a non-reactive, non-scattering pigment. The developer material is capable of reacting with a color precursor to produce a visible image while the pigment reduces tack. Both the developer material and the pigment are capable of forming an essentially transparent film upon the application of heat and/or pressure.

20 Claims, No Drawings

GLOSSABLE DEVELOPER SHEET WITH REDUCED TACK

BACKGROUND OF THE INVENTION

The present invention relates to a photosensitive imaging system of the type which employs microcapsules containing a photosensitive composition in the internal phase. More particularly, it relates to a photosensitive system wherein the developer sheet has reduced tack.

Photosensitive imaging systems employing microencapsulated radiation sensitive compositions are the subject of commonly assigned U.S. Pat. Nos. 4,399,209 and 4,416,966 as well as co-pending U.S. patent application Ser. No. 320,643 filed Jan. 18, 1982. These imaging systems are characterized in that an imaging sheet including a layer of microcapsules containing a photohardenable or photosoftenable photosensitive composition in the internal phase is image-wise exposed to actinic radiation. In the most typical embodiments, the photosensitive composition is a photopolymerizable composition including a polyethylenically unsaturated compound and a photoinitiator and is encapsulated with a color precursor. The exposure image-wise hardens the internal phase of the microcapsules. Following exposure, the imaging sheet is subjected to a uniform rupturing force by passing the sheet through the nip between a pair of pressure rollers. U.S. Pat. No. 4,399,209 discloses a transfer system in which the imaging sheet is assembled with a developer sheet prior to being subjected to the rupturing force. Upon passing through the pressure rollers in contact with the developer sheet, the microcapsules image-wise rupture and release the internal phase whereupon the color precursor migrates to the developer sheet where it reacts with a dry developer and forms a color image. The imaging system can be designed to reproduce monochromatic or polychromatic full color images.

Commonly assigned U.S. Pat. No. 4,554,235 provides an imaging system which is useful in producing high gloss images and is characterized in that the reactive surface of the developer sheet is overcoated with a discontinuous layer of a thermoplastic polymeric pigment. Images are formed as described in U.S. Pat. Nos. 4,399,209 and 4,416,966. After development, the developer sheet is heated to coalesce the thermoplastic pigment and form a thin uniform layer which imparts gloss to the image.

Commonly assigned U.S. application Ser. No. 905,727 filed Sept. 9, 1986 describes a developer sheet which is used to obtain glossy images which obviates the need for the layer of thermoplastic pigment described in the aforementioned patent. This sheet carries a layer of a finely divided thermoplastic developer resin such as a novolak. The developer layer is obtained from a dispersion of the resin in water. After transfer, the color precursor reacts with the developer and the sheet is heated to melt the developer resin. Thereupon the finely divided particles coalesce into a thin, uniform film. By controlling the heating conditions, the degree of gloss can be controlled to give copies with finishes ranging from matte to high gloss.

While the developer sheets described in the aforementioned application are extremely advantageous, several problems have been encountered in designing sheets for commercial use. One problem is that the developer resins are undesirably tacky. This tackiness results in the developer sheets being difficult to handle. For example, when the developer sheets are stacked, there is a tendency for them to stick to one another. Also, when the developer sheets are fed into the processing equipment, the developer resin may soil paper handling rollers. Also, after the imaged developer sheets are fused, the tendency to stick increases. During any phase in the life of a developer sheet, if the tackiness problem is severe enough, the entire developer layer can be stripped from the developer sheet.

In the carbonless paper art, developer sheets prepared from novolak resins have been modified as described below to improve their performance. In the past, finely divided developer resins have been obtained by grinding a mixture of a developer such as a phenolic resin or a zinc salicylate with another resin and clay to produce a resin grind which is applied to the surface of the developer sheet. For example, U.S. Pat. No. 3,924,027 discloses a composition including a zinc salicylate, polystyrene, and kaolin.

One approach to improving the handling characteristics of developer sheets is to incorporate a stilt material such as starch particles as disclosed in commonly assigned U.S. Pat. Nos. 4,399,209 and 4,440,846.

U.S. Pat. No. 4,470,058 teaches a two-coat record sheet for printing by xerographic methods wherein the nonreactive topcoat eliminates the accumulation of contaminants on the fuser roll of copier/duplicators. The record sheet has a base coat comprising a phenol-formaldehyde novolak resin and a topcoat comprising a nonreactive pigment material. The reference discloses that the preferred nonreactive pigments are such materials as kaolin clay, calcium carbonate and calcined kaolin clay.

Commonly assigned U.S. Pat. No. 3,617,410 discloses a record sheet having improved resistance to smudging wherein the base sheet is coated with a composition comprising a finely powdered, oil-soluble, acid-reactant, polymeric material such as a novolak resin, a substantially nonreactive pigment such as talc, clay, colloidal silica, etc. and a binder.

U.S. Pat. No. 4,422,670 discloses a developing sheet designed for high speed printing so as to rapidly set the printing ink containing a developing layer consisting of a color developing agent, calcium carbonate and styrene-butadiene copolymer latex or modified styrene-butadiene copolymer latex of an average particle size of less than 0.08 microns. The latex reduces pigment pick off. The combination is taught to result in an improvement in the water resistance, mark formation ability and printability of the pressure-sensitive recording paper.

SUMMARY OF THE INVENTION

The present invention provides a developer sheet having reduced tack. The developer sheet is useful in forming reproductions having a controlled gloss finish or in forming transparencies. The developer sheet comprises a support having a layer on the surface of the support of a finely divided thermoplastic developer material which is capable of reacting with a color precursor to produce a visible image, and a non-scattering, non-reactive pigment which reduces tack. Both the developer material and the pigment are selected to provide an essentially transparent film upon the application of heat and/or pressure.

The term "non-scattering" as used herein with respect to the pigment means that the refractive index of the pigment is such that upon melting the developer material, an essentially transparent layer is obtained. In accordance with one embodiment of the invention, the pigment is a thermoplastic material which melts and coalesces with the developer material upon heating. However, it is not essential that the pigment be thermoplastic provided that it is wet by the thermoplastic material and rendered transparent upon heating.

The term "non-reactive" means that the pigment is not a developer, i.e., it does not react with the color precursor to produce coloration.

The applicants have found that the amount of developer material on the surface of the developer sheet can be reduced and replaced by a non-reactive, non-scattering pigment to reduce tack without sacrificing image density. Two factors which influence image density are developer reactivity and the void volume of the developer layer. If the developer material is highly reactive, the amount of developer material present on the developer sheet can be decreased if the void volume of the layer is maintained. In the present invention, the pigment serves to reduce tack while maintaining sufficient void volume to produce a high density image. Thus, in addition to providing substantial cost savings due to the decreased amount of developer resin required and providing an image having good color density, the present invention eliminates or substantially reduces tack.

Thus, an object of the present invention is to provide a developer sheet having reduced tack which eliminates the handling problems as discussed previously.

Other objects and advantages of the present invention will become apparent from the following description and the appended claims.

DETAILED DESCRIPTION OF THE INVENTION

The imaging system of the present invention includes an imaging sheet carrying a layer of photosensitive microcapsules and a developer sheet. The imaging sheet, as well as the photosensitive compositions, photoinitiators, color formers, wall formers, encapsulation techniques and development techniques described in U.S. Pat. No. 4,399,209, which is herein incorporated by reference, are useful herein. Preferred photosensitive compositions are described in U.S. application Ser. No. 917,873 filed Oct. 10, 1986.

The developer materials used in the present invention are finely divided reactive thermoplastic pigments which are capable of reacting with a color precursor and forming a color image. Their melting points typically range from about 100° to 200° C., but those skilled in the art will appreciate that materials with higher and lower melting points may also be useful. The particle size is typically in the range of about 0.5 to 25 microns.

A typical example of a thermoplastic developer material useful in the present invention is phenolic resins. Phenolic resins have been conventionally used as developer materials in carbonless, pressure-sensitive recording materials. These resins may be the condensation product of phenols which are preferably para-substituted and formaldehyde. The resins may be further modified to include amounts of salicylic acid or substituted salicylic acids in a manner known in the art. Examples of phenolic resins useful in the present invention are thermoplastic resins prepared according to the teachings in U.S. Pat. Nos. 3,455,721; 3,466,184; 3,672,935; 4,025,490; and 4,226,962.

Another class of phenolic resin useful in the present invention is the products of oxidative coupling of substituted or unsubstituted phenols or biphenols such as the resins described in commonly assigned and recently allowed U.S. application Ser. No. 797,585 filed Nov. 13, 1985 which is incorporated herein by reference.

The phenolic developers used in the present invention are usually metallated to improve their developing characteristics. They may be metallated by reaction with a salt such as an oxide or propionate of a metal selected from the group consisting of copper, zinc, aluminum, tin, cobalt and nickel. Most typically, the resins are zincated. The metal content of the resins generally is about 1 to 5% by weight but may range up to 15%.

Preferably phenol-formaldehyde condensation products are used as developer materials. More particularly, alkylphenolic resins and, still more particularly, metallated products of alkylphenolic resins are used. The alkylphenols are usually monosubstituted by an alkyl group which may contain 1 to 12 carbon atoms. Examples of alkylphenols are ortho- or para-substituted ethylphenol, propylphenol, butylphenol, amylphenol, hexylphenol, heptylphenol, octylphenol, nonylphenol, t-butylphenol, t-octylphenol, etc.

Another class of thermoplastic developer material is a resin-like condensation product of a polyvalent metal salt, and a phenol, a phenol-formaldehyde condensation product, or a phenol-salicylic acid-formaldehyde condensation product. One example of this developer material is available from Schenectady Chemical Co. under the designation HRJ 4250 and HRJ 4252. These products are reported to be a metallated condensation product of an ortho- or para-substituted alkylphenol, a substituted salicylic acid, and formaldehyde.

It is critical that the developer materials be present on the surface of the developer sheet as finely divided particles (preferably about 1 to 5 microns in size).

Finely divided thermoplastic developer material useful in the present invention may be obtained by several processes. A developer material can be prepared in a conventional manner and a melt of the material can be atomized. Alternatively, a melt of the developer material can be injected into a rapidly agitated aqueous medium whereupon the melt is solidified as droplets which are recovered. The developer material can also be dissolved in a solvent/non-solvent system and the solvent removed. Other materials such as Schenectady HRJ 4250 and HRJ 4252 are obtained in a dispersed form. Other methods of forming aqueous emulsions of developer resins are described in U.S. Pat. No. 4,612,254.

The pigments used in the present invention to reduce tack are non-scattering pigments. The refractive index of the pigment should be approximately the same as that of the developer material.

Examples of non-melting pigments are coating clays (such as Kaolin), silica, alumina, and talc. While one of the advantages of the present invention is that tack can be reduced by replacing a reactive developer resin with a non-reactive pigment, it will be understood that the use of reactive clays instead of non-reactive clays clearly will not detract from the present invention.

While non-melting pigments can be used, the preferred pigments are non-reactive thermoplastic pigments having a melting point similar to the melting point of the developer material capable of being fused with the developer material to form an essentially transparent film upon the application of heat or pressure. Typical examples of useful thermoplastic pigments include thermoplastic polymer pigments, latices and wax particles.

The pigment preferably has a particle size in the range of about 0.5 to 25 microns, and more preferably, about 1 to 10 microns and a melting point less than about 200° C.

The amount of the pigment mixed with the developer material is a function of the nature of the pigment, its particle size and the developer reactivity. Typically the pigment is employed in an amount of about 0.1 to 1.0 parts by weight per 1 part by weight developer material.

Typical examples of useful pigments are pigments obtained upon drying such as Dow XD 899301 latex, Dow 722 latex, Dow 788 latex, products of Dow Chemical Co., UCAR 4630x latex, UCAR 4510 latex, styrene-acrylic latices of Union Carbide Corp., polyvinyl acetate emulsion 202A, a product of Union Oil Company of California, polystyrene latices 5611 and 5612, products of Union Oil Co. of California, Polysar 1183, Polysar 9010-P and Polysar 1164, polystyrene latices of Polysar Latex Co., acrylic latex 200, a product of Union Oil Co. of California, polyvinylidene chloride latices 542 and MS-153, products of Union Oil Co. of California, Casco wax, a wax emulsion from Borden Co., and Paraco, a wax emulsion from Hercules Chemical Co.

To prepare the developer sheet, the developer material can be mixed with the pigment and coated on a support in a conventional manner. In most cases, aqueous emulsions or dispersions of the developer material and the pigment will simply be mixed. Coating methods such as doctor blade coating, wire wound bar coating, roll coating etc. may be used. For transparencies, transparent substrates such as a polyester film which is commercially available as Mylar from E. I. Du Pont de Nemours & Co., Inc. may be used. Otherwise, paper may be used. The developer material and pigment are applied to the support in combined amounts of about 3 to 15 g/²sq.m.

In most cases, heat or a combination of heat and pressure is used to film out the developer material and the pigment (when the pigment is thermoplastic). For example, after color development in a photosensitive system, the developer material and pigment are filmed out by heating the developer sheet to a temperature above the melting point of the resin by contact with a heated roller or a pair of heated rollers or by the passage of the developer sheet over a heater platen. Alternatively, the developer sheet can be placed in a hot oven.

Preferably the developer sheet is heated after transferring the color precursor to the surface of the developer sheet as opposed to simultaneously therewith. This enables the color precursor to fully react with the developer material while its surface area is high and while the void volume of the developer layer is high and consequently better image density is obtained.

As previously indicated, imaging sheets useful in the present invention can be prepared by following the teachings in U.S. Pat. No. 4,399,209.

Positive-working photosensitive compositions useful in the present invention usually include a photoinitiator in combination with a monomer, a dimer, or an oligomer which is polymerizable to a higher molecular weight compound, or a polymer which is crosslinked upon exposure. For a negative working material, a compound which is depolymerizable or otherwise photolyzable upon exposure is used.

Ethylenically unsaturated organic compounds are useful photosensitive materials. These compounds contain at least one terminal ethylene group per molecule. Typically, liquid ethylenically unsaturated compounds having two or more terminal ethylene groups per molecule are preferred. Examples of this preferred subgroup are ethylenically unsaturated acid esters of polyhydric alcohols such as ethylene glycol dimethacrylate, triethylene glycol dimethacrylate, trimethylolpropane triacrylate (TMPTA) and trimethylol propane trimethacrylate. Another example of a useful radiation sensitive composition is an acrylate prepolymer derived from the partial reaction of pentaerythritol with acrylic acid, methacrylic acid, or acrylic or methacrylic acid esters. Another group of substances useful as photosensitive compositions include isocyanate modified acrylic, methacrylic and itaconic acid esters of polyhydric alcohols.

Negative working imaging systems can be obtained by encapsulating photosoftenable compositions in the microcapsules. An example of a photosoftenable material that may be useful in the invention is polyaldehydes as described in U.S. Pat. Nos. 4,108,839; 3,984,253; and 3,915,704; polycarbonates as described in Frecht et al., *J. Imaging Science*, 30 (2). p. 59 (1986); 3-oximino-2-butanone methacrylate which undergoes main chain scission upon U.V. exposure, poly 4'-alkyl acylophenones, and certain resins having a quinone diazide residue. See Reichmanis, E.; *Am. Chem. Soc. Div. Org. Coat. Plast. Chem. Prepr.* 1980. 43, 243–251 and Lukac, I.; Chmela S., Int. Conf. on Modif. Polym. 5th Bratislave, Czech. July 3–6, 1979, I.U.P.A.C. Oxford, England 1979, 1, 176–182.

In most cases, the photosensitive composition includes a photoinitiator. It is possible to use either homolytic photoinitiators which are converted to an active species by radiation and generate a radical by abstracting a hydrogen from a hydrogen donor, or photoinitiators which complex with a sensitizer to produce a free radical generating species, or photoinitiators which otherwise generate radicals in the presence of a sensitizer. If the system relies upon ionic polymerization, the photoinitiator may be the anion or cation generating type, depending on the nature of the polymerization.

Examples of photoinitiators useful in the present invention include diaryl ketone derivatives, and benzoin alkyl ethers. The photoinitiator is selected based on the sensitivity of the system that is desired. Where ultraviolet sensitivity is desired, suitable photoinitiators include alkoxy phenyl ketones, O-acylated oximinoketones, polycyclic quinones, benzophenones and substituted benzophenones, xanthones, thioxanthones, halogenated compounds such as chlorosulfonyl and chloromethyl polynuclear aromatic compounds, chlorosulfonyl and chloromethyl heterocyclic compounds, chlorosulfonyl and chloromethyl benzophenones and fluorenones, and haloalkanes. In many cases, it is advantageous to use a combination of imaging photoinitiators.

For visible light sensitivity, see U.S. application Ser. No. 917,873 filed Oct. 10, 1986.

The amount of photoinitiator used in the photosensitive composition depends on the particular photosensitive material selected. It must be present in an amount sufficient to initiate the photochemistry within a short exposure time. The photoinitiator may be used to sequester oxygen which is present in the microcapsules and inhibits photopolymerization by conducting a non-imaging, oxygen sequestering pre-exposure or co-exposure. When the photoinitiator is also relied upon for sequestering oxygen, it must be used in amounts sufficient to fulfill both this function and its imaging function.

It is possible to use various compounds as the chromogenic materials in the present invention. If the chromogenic material is encapsulated with the photosensitive composition, it should not interfere with the sensitivity of the system. One example of a chromogenic material useful in the invention is colorless electron donating compounds. Representative examples of such color precursors include substantially colorless compounds having in their partial skeleton a lactone, a lactam, a sulfone, a spiropyran, an ester or an amido structure such as triarylmethane compounds, bisphenylmethane compounds, xanthene compounds, fluorans, thiazine compounds, spiropyran compounds and the like. Crystal Violet Lactone and Copikem X, IV and XI (products of Hilton-Davis Co.) are often used alone or in combination as color precursors in the present invention.

Images can also be formed by encapsulating a chelating agent, as a chromogenic material, which reacts with a metal salt, as a developer, to generate a color image upon being released from the microcapsules. Some typical examples of useful image-forming pairs of this type are nickel nitrate and N,N'bis(2-octanoyloxyethyl)dithiooxamide, and alum [Fe(III)] and yellow prussiate.

The internal phase may also include an oil. Inclusion of the oil will often improve half tone gradation. Examples of carrier oils are alkylated biphenyls (e.g., monoisopropylbiphenyl), polychlorinated biphenyls, castor oil, mineral oil, deodorized kerosene, naphthenic mineral oils, dibutyl phthalate, dibutyl fumerate, brominated paraffin and mixtures thereof. Alkylated biphenyls are generally less toxic and preferred.

The photosensitive microcapsules used in the present invention are easily formed using conventional techniques such as coacervation, liquid-liquid phase separation, interfacial polymerization and the like. Various melting, dispersing and cooling methods may also be used.

The photosensitive compositions are usually oleophilic and can be encapsulated in hydrophilic wall-forming materials such as gelatin-type materials (see U.S. Pat. Nos. 2,730,456 and 2,800,457 to Green et al.) including gum arabic, polyvinyl alcohol, carboxymethylcellulose; resorcinol-formaldehyde wall formers (see U.S. Pat. No. 3755,190 to Hart et al.); isocyanate wall-formers (see U.S. Pat. No. 3,914,511 to Vassiliades); isocyanate-polyol wall-formers (see U.S. Pat. No. 3,796,669 to Kirintani et al.); urea-formaldehyde wall-formers, particularly urea-resorcinol-formaldehyde in which oleophilicity is enhanced by the addition of resorcinol (see. U.S. Pat. Nos. 4,001,140; 4,087,376 and 4,089,802 to Foris et al.); and melamine-formaldehyde resin and hydroxypropyl cellulose (see commonly assigned U.S. Pat. No. 4,025,455 to Shackle).

The developer sheet of the present invention is particularly useful in full color imaging systems such as those described in U.S. application Ser. No. 339,917 to Sanders et al, filed Jan. 18, 1982 which is incorporated herein by reference. The microcapsules used in full color imaging individually contain cyan, magenta and yellow color precursors and photosensitive compositions having distinctly different sensitivities. A uniform mixture of the microcapsules is distributed over the surface of the support. Images are formed by separating the red, green and blue components of the image to be reproduced and, if necessary, translating these components into different wavelengths of actinic radiation to which the photosensitive compositions are distinctly sensitive. The photosensitive material is image-wise exposed to the translated radiation and thereafter it is subjected to a uniform rupturing force, such as pressure, which causes the microcapsules in the underexposed and unexposed areas to rupture and release the color precursors. The color precursors then react with the developer material to product a full color image.

The spectral sensitivity of photosensitive microcapsules is principally a function of the photoinitiator used in the encapsulated photosensitive composition. In order to design photosensitive microcapsules useful in full color imaging having distinctly different spectral sensitivities, photoinitiators must be designed or selected which have mutually exclusive sensitivities in at least three distinct wavelength regions. That is, the photoinitiator used in a microcapsule containing a cyan color precursor must be substantially more sensitive in a wavelength region in which the photoinitiators used in the microcapsules associated with the magenta and yellow color precursors are substantially less sensitive and ideally insensitive. Likewise, the photoinitiator used in the microcapsules containing the cyan color precursor must be substantially less sensitive and ideally insensitive in a wavelength region in which the photoinitiators used in the microcapsules containing the magenta and yellor color precursors are preferentially sensitive. The same considerations govern the selection of the initiators associated with the microcapsules containing the yellow and magenta color precursors. Of course, in a visible light sensitive system, initiators are selected which are selectively sensitive to red, green and blue light.

In addition to being useful in photosensitive systems of the type described above, the developer sheet of the present invention is also useful in conventional pressure-sensitive carbonless systems.

The present invention is illustrated in more detail by the following non-limiting examples:

EXAMPLE 1

A coating mixture was prepared with the following composition:
HRJ-4250 Developer Emulsion (50% solids) a product of Schenectady Chemical Co.: 500 g
Deionized water: 210 g
Borden Cascowax EW-403H: 71 g.

This mixture of developer emulsion and wax emulsion was machine coated on 80 lb. Black and White glossy (a product of The Mead Corp.) with a #18 Meyer rod. A control coating was made with only the HRJ-4250 and water.

Monochrome cyan, magenta, and yellow capsule sheets prepared as described in U.S. application Ser. No. 755,400, filed July 16, 1985, were exposed and developed against the test and control developer sheets. After heating at 150° C. for one minute, a slight density gain was noted for the wax system, presumably due to a higher attained gloss. The fused wax sheet felt much less tacky than the developer-only developer sheet.

EXAMPLE 2

The pH of Lytron 2705 latex (Morton Thiokol) was adjusted from 8.8 to 5.7 with 10% $H_2SO_4$ and diluted to 35% solids, HRJ-4250 at pH 5.7 was also adjusted to 35%. The two emulsions were mixed in the following ratios and then coated on PV Alcohol-subbed 3 mil Mylar ® with a #24 Meyer bar and allowed to dry:

|  | Sample | | | | |
| --- | --- | --- | --- | --- | --- |
|  | A | B | C | D | E |
| 35% 4250 | 10.0 | 9.0 | 7.0 | 5.0 | 3.0 |
| 35% Lytron | 0.0 | 1.0 | 3.0 | 5.0 | 7.0 |
| Magenta D | 0.62 | 0.64 | 0.70 | 0.68 | 0.62 |
| Cyan D | 1.53 | 1.55 | 1.62 | 1.63 | 1.44 |

Standard cyan and magenta monochrome capsule sheets were developed against these sheets, the sheets were heated at 150° C. for 60 seconds, and transmission densities measured as above.

Thus, even at a replacement of 50% of the developer spheres with Lytron, no appreciable density loss was noted. At this level, however, a slight haziness was evident in the transparency.

Having described the invention in detail and by reference to preferred embodiments thereof, it will be apparent that modifications and variations are possible without departing from the scope of the invention defined in the appended claims.

What is claimed is:

1. A developer sheet having reduced tack and a controlled gloss finish comprising a support having a layer on a surface of said support comprising a mixture of a finely divided thermoplastic developer material and a non-reactive, non-scattering thermoplastic pigment, said developer material being capable of reacting with a color precursor to produce a visible image, said pigment being capable of reducing the tack of said layer, said layer forming an essentially transparent film upon the application of heat and/or pressure.

2. The developer sheet of claim 1 wherein said developer material is a phenolic resin.

3. The developer sheet of claim 2 wherein said developer material is a phenol-formaldehyde resin.

4. The developer sheet of claim 3 wherein said developer material has a particle size of about 0.5 to 25 microns.

5. The developer sheet of claim 4 wherein said developer material has a melting point less than about 200° C.

6. The developer sheet of claim 1 wherein said pigment comprise wax particles or a thermoplastic latex.

7. The developer sheet of claim 5 wherein said pigment has a particle size of about 0.5 to 25 microns.

8. The developer sheet of claim 7 wherein said pigment has a melting point less than about 200° C.

9. The developer sheet of claim 8 wherein said pigment is present in an amount of about 0.1 to 1.0 parts by weight per 1 part by weight developer material.

10. A microencapsulated imaging system comprising an imaging sheet including a support having a layer of photosensitive microcapsules on the surface thereof, said microcapsules containing a photohardenable or photosoftenable photosensitive composition in the internal phase and having a color precursor associated therewith; and a developer sheet having reduced tack comprising a support having a layer on a surface of said support comprising a mixture of a finely divided thermoplastic developer material and a non-reactive, non-scattering pigment, said developer material being capable of reacting with a color precursor to produce a visible image, said pigment being capable of reducing the tack of said developer layer, and said layer forming an essentially transparent film upon the application of heat and/or pressure.

11. The imaging system of claim 10 wherein said developer material is a phenolic resin.

12. The imaging system of claim 11 wherein said developer material is a phenol-formaldehyde resin.

13. The imaging system of claim 12 wherein said developer material has a particle size of about 0.5 to 25 microns.

14. The imaging system of claim 13 wherein said developer material has a melting point less than about 200° C.

15. The imaging system of claim 10 wherein said pigment is a thermoplastic polymer.

16. The imaging system of claim 10 wherein said pigment comprises wax particles.

17. The imaging system of claim 15 wherein said pigment has a particle size of about 0.5 to 25 microns.

18. The imaging system of claim 17 wherein said pigment has a melting point less than about 200° C.

19. The imaging system of claim 18 wherein said pigment is present in an amount of about 0.1 to 1.0 parts per 1 part developer material.

20. A process for forming images which comprises image-wise exposing to actinic radiation an imaging sheet including a support having a layer of microcapsules on a surface thereof, said microcapsules including a photohardenable or photosoftenable photosensitive composition in the internal phase and having a color precursor material associated therewith;

subjecting said imaging sheet to a uniform rupturing force such that said microcapsules rupture and release said internal phase in accordance with said image-wise exposure;

contacting said imaging sheet with a developer sheet having reduced tack comprising a support having a layer on a surface of said support comprising a mixture of a finely divided thermoplastic developer material and a non-reactive, non-scattering pigment, said developer material being capable of reacting with said color precursor to produce a visible image, said pigment reducing the tack of said developer layer, and said layer forming an essentially transparent film upon the application of heat and/or pressure, said contacting being conducted at the same time or immediately after subjecting said imaging sheet to said rupturing force such that said internal phase migrates to said developer material; and fusing said layer to form an essentially transparent film.

* * * * *